United States Patent [19]

Dinella et al.

[11] 4,269,138

[45] May 26, 1981

[54] APPARATUS FOR DISTRIBUTING LIQUID OVER A SURFACE

[75] Inventors: Donald Dinella, Berkley Heights; Albert H. Haller, Clark; Theodore D. Polakowski, Jr., Bergenfield, all of N.J.

[73] Assignee: Western Electric Company, Inc., New York, N.Y.

[21] Appl. No.: 32,616

[22] Filed: Apr. 23, 1979

[51] Int. Cl.³ .............................................. B05C 11/02
[52] U.S. Cl. ..................................... 118/115; 29/131; 29/132; 118/424; 118/425
[58] Field of Search ...................... 118/424, 425, 115; 427/409, 417, 414; 428/447, 448, 282, 450, 906, 473, 425.8; 29/131, 132

[56] References Cited

U.S. PATENT DOCUMENTS

| 280,447 | 7/1883 | Campbell | 29/131 |
|---|---|---|---|
| 844,513 | 2/1907 | Gill | 118/424 |
| 1,067,805 | 7/1913 | Diescher | 118/424 |
| 2,172,479 | 9/1939 | McMillen | 15/210 A |
| 3,559,553 | 2/1971 | Buechner | 118/425 |
| 3,686,731 | 8/1972 | Koori et al. | 428/450 |
| 3,694,071 | 9/1972 | Touchette | 118/109 |
| 3,779,207 | 12/1973 | Benson et al. | 118/109 |
| 3,843,389 | 10/1974 | Enomoto | 118/424 |
| 3,910,186 | 10/1975 | D'Amato et al. | 29/132 |
| 3,968,020 | 7/1976 | Nagano et al. | 118/425 |

FOREIGN PATENT DOCUMENTS 913457 10/1972 Canada ...................................... 118/424

Primary Examiner—Ronald H. Smith
Assistant Examiner—S. L. Childs
Attorney, Agent, or Firm—J. J. Jordan; J. L. Landis

[57] ABSTRACT

A surface of a substrate 11 (FIG. 2) is uniformly coated with a liquid L by wetting the surface with the liquid and compressibly contacting the wetted surface with an applicator member 10 having an outer layer 14 of a compressible liquid absorbing material with inverse sponge characteristics and an inner layer 13 of compliant material. Preferably the member is a roller 10 having a silicone rubber or polyurethane inner layer and a chamois outer layer. A plurality of the rollers 10 are arranged to be in compressive contact with the surfaces of a plurality of substrates 11 as the substrates are being removed from the liquid L (arrow A), the movement of the substrates 11 causing rotation (arrow F) of the rollers to apply a uniform coating of the liquid on the contacted surfaces.

23 Claims, 8 Drawing Figures

APPARATUS FOR DISTRIBUTING LIQUID OVER A SURFACE

TECHNICAL FIELD

This invention relates generally to apparatus and for applying and uniformly distributing a liquid coating on a surface of an article, such as a printed circuit substrate.

BACKGROUND OF THE INVENTION

During the manufacture of certain types of printed circuits, particularly electroless-plated printed circuits, an insulating surface of a substrate is to be coated with a treating solution. One specific example of such a process, with which the present invention is especially adapted for use, is disclosed in a related copending application of W. M. Beckenbaugh et al. entitled "A Method for Depositing a Metal on a Surface," Ser. No. 967,549, filed Dec. 7, 1978, now abandoned herein incorporated by reference. As disclosed in that application, a substrate such as epoxy-coated steel is first pretreated with reagents such as methyl ethyl ketone, followed by an etchant containing chromic trioxide, sulfuric acid, and phosphoric acid to render the plastic surface receptive to coating with a special sensitizer solution, such as an aqueous solution of copper formate, the disodium salt of 2, 7 anthraquinone disulfonic acid, sorbitol, and butanol. Examples of such treating solutions and process parameters are provided in the copending application.

As described in that application, the pretreated substrate is coated with the sensitizing solution, as by immersion, dip coating, roller coating, curtain coating, spraying or the like to deposit a layer or film of the sensitizer liquid on the working surfaces of the substrate, that is, the surfaces where printed circuits are to be formed. The treated substrate is then heated in an oven to dry the sensitizer coating and form a thin solid film of the sensitizer on the plastic surface, preparatory to the electroless deposition process.

As described in detail in the copending application, the electroless deposition process involves exposing selected portions of the dried sensitizer film to ultraviolet light through a mask, to form catalytic metal deposition sites at the exposed areas; removing the sensitizer film from the unexposed areas; and then electrolessly plating a conductive metal such as copper on the exposed portions of the substrate surface to form the desired printed circuit pattern.

Another specific example of a process for depositing a metal on a substrate is disclosed in U.S. Pat. No. 4,098,922 herein incorporated by reference which describes a sensitizer liquid with which the present invention is well suited to use.

If the metal deposited on the substrate is to be of a uniform thickness and to adhere properly to the exposed areas of the sensitizer film defining the patterns, the sensitizer liquid must initially be applied uniformly over the surface of the substrate, prior to the drying stage, so as to provide a dried film having a predetermined thickness as uniform as possible.

Additionally, a problem arises with substrates having plated apertures, or thru-holes; that is, holes through the substrate, the walls of which are to be plated such that circuitry on one surface of the board is electrically connected to circuitry on the opposite surface of the board. In this situation, the sensitizer liquid must be applied so that it flows through the holes and forms a uniform continuous coating along the sides of the hole. In this process, there is a tendency for the sensitizer liquid to form a thin skin or "windowpane" across the diameter of the hole, in which case the sensitizer liquid does not flow completely through the hole and uniformly coat the walls thereof. Also, during the subsequent process step of exposing the dried sensitized surface to ultraviolet light, the windowpane tends to prevent the ultraviolet light from entering the hole and forming catalytic sites on the coated walls of the hole. Furthermore, it is desired to apply the sensitizer liquid in a dripless manner, which does not permit any buildup or ridges of sensitizer fluid along edges of the board, particularly along the bottom edge when a simple dip-coating process is used, as described in the copending application.

SUMMARY OF THE INVENTION

In accordance with the foregoing discussion, certain specific objects of the invention are to provide new and involved apparatus for coating a surface of a printed circuit substrate with a uniform-thickness film of a low-viscosity sensitizer liquid of the type described in the copending application, for uniformly coating the walls of thru holes while eliminating windowpane formations in the holes, and for preventing buildup of the liquid along the edges of the substrate.

More general objects are to provide apparatus for uniformly distributing a liquid coating on one or more surfaces of an article, and particularly for simultaneously coating opposing surfaces of a flat article, such as a substrate, with a treating liquid, while uniformly coating the walls of any thru holes in the article and avoiding liquid buildup along the edges.

With the foregoing and other objects in view, apparatus in accordance with certain features of the invention involves applying a uniform coating of a liquid on a surface of an article, using an applicator member including an outer layer of a compressible liquid-absorbing material having inverse sponge characteristics, as defined hereafter, and an inner portion of compliant material adapted to compress the outer layer against the surface of the workpiece to be coated. In the process, the surface is first wet with the liquid, and the wet surface is then contacted with the compressed outer layer of the applicator member, so that the outer layer uniformly distributes the liquid across the contacted surface of the article.

Preferably, the outer layer is fabricated of chamois or chamois-like material, particularly synthetic chamois, and the inner portion is a resilient, deformable layer, preferably of an elastomeric material such as polyurethane or silicone rubber. Preferably, the applicator is a freely rotatable liquid-applicator roller having a solid core, an intermediate layer of the compliant material, and an outer, surface layer of synthetic chamois. In this arrangement, the article may be dipped into a bath of the liquid, and then withdrawn from the liquid with the wet surface of the article in compressive engagement with the surface of such roller. In particular, opposed pairs of the rollers may be mounted to compressively engage opposite surfaces of a flat workpiece, such as a printed circuit substrate.

In a specific embodiment of coating apparatus in accordance with the invention, pairs of spring-biased applicator rollers are mounted on opposite surfaces of elongated support arms for insertion between vertically suspended substrates that are immersed in the coating liquid. Preferably, the arms can be rotated approximately 90° between two positions, in a first of which the rollers can be freely inserted into a space between the substrates, and in a second of which the rollers contact and compressively engage the adjacent surfaces of the substrates.

Other objects, specific advantages, and features of the invention will be apparent from the following detailed description of specific examples and embodiments thereof, when read in conjunction with the accompanying drawings.

DETAILED DESCRIPTION

Figure 1:
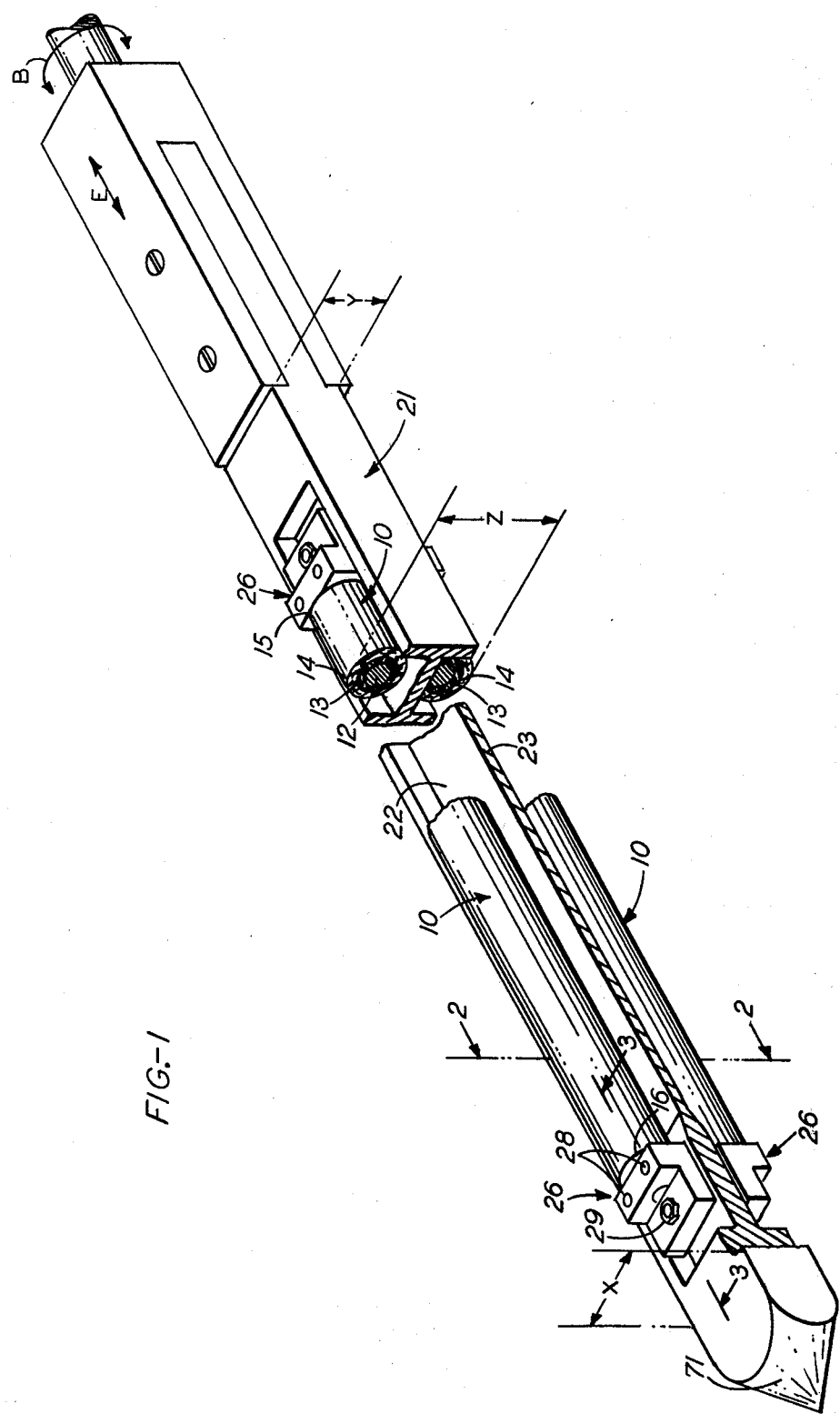
FIG. 1 is a perspective view of a coating assembly including a pair of liquid-applicator rollers and a support arm therefor in accordance with one specific embodiment of the invention, illustrating a retracted vertical position of the rollers.
Figure 5:
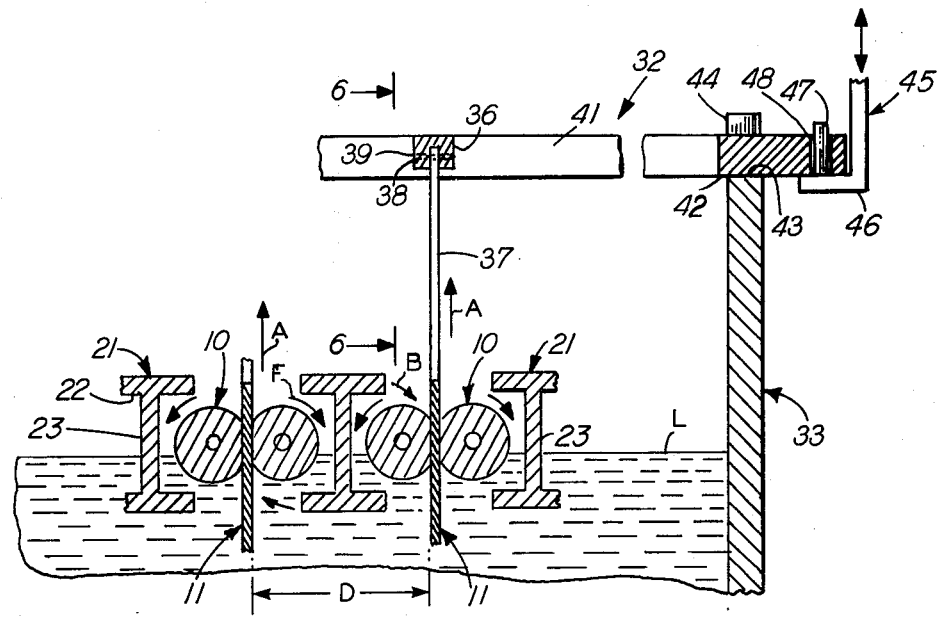
FIG. 5 is a fragmentary vertical section along line 5—5 of FIG. 4, illustrating the rollers in the operating positions at a time near the start of a liquid-distributing operation.
Figure 7:
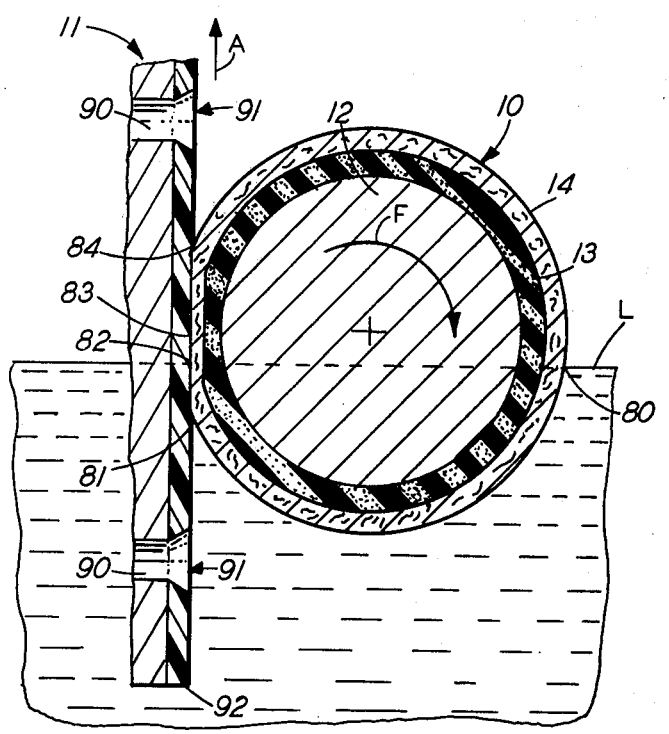
FIG. 7 is a greatly enlarged view similar to a portion of FIG. 5, at a later stage in process, and having certain dimensions exaggerated to illustrate principles of operation.

Referring now in detail to the drawings, and particularly to FIGS. 1, 5 and 7, there is illustrated a liquid-applicator member or roller 10 in accordance with one specific embodiment of the invention, for applying a uniform coating of a liquid (L) on a surface of an article, such as a printed circuit substrate 11. Preferably, opposing pairs of the rollers 10 are deployed in an operating, liquid-distributing position, as illustrated in FIG. 5, to simultaneously apply the liquid coating to opposite planar surfaces of one or more substrates 11 that are advanced out of a bath of the coating liquid L and between a pair of the rollers 10—10, as indicated by arrows A in FIGS. 5 and 7.

As best illustrated in FIGS. 1 and 7, each roller 10 includes a solid cylindrical core 12, an intermediate compression layer 13 of a soft, compliant material, and an outer layer 14 of a compressible liquid-absorbing material that contacts the surface of the article to be coated, as illustrated in FIG. 7. Preferably, the core 12 is composed of an inert, hard material, such as stainless steel, to withstand corrosion, etching, oxidation or decomposition of the core by any corrosive fluids which it may come in contact. The intermediate, compression layer 13 is fabricated as an annular layer of a soft, compliant material, preferably an elastomeric material such as polyurethane or silicone rubber, and is securely fastened to and covers the core 12 along its entire length, as viewed in FIG. 1. Typically, the layer 13 is secured to the core 12 by adhesive bonding techniques; for instance using a silicone-rubber based adhesive. This type of material for the compression layer 13 is selected primarily for two reasons: (1) to withstand corrosive effects of certain coating liquids, and (2) to provide a predetermined degree of elastic compression of the layers 13 and 14 during the coating process, as described in detail hereafter under the heading "Operation."

The outer contact layer 14 of the roller 10 is formed of a material, such as synthetic chamois, having special liquid-absorbing characteristics as described in detail hereafter, and serves to contact the surface of the substrate 11 to be coated so as to distribute a uniform coating of the liquid thereon in accordance with the principles of the invention. The chamois layer 14 is preferably an annular layer that is wrapped about and fastened to the intermediate layer 13 by an adhesive, similar to that mentioned above, along the entire length of the roller 10; that is, from a right end 15 to a left end 16 of the roller as viewed in FIG. 1. Any commercial grade synthetic chamois can be used for the layer 14, such as REGULAR VAM Synthetic Chamois, manufactured by Pellon Corporation of Lowell, Mass.

Figure 2:
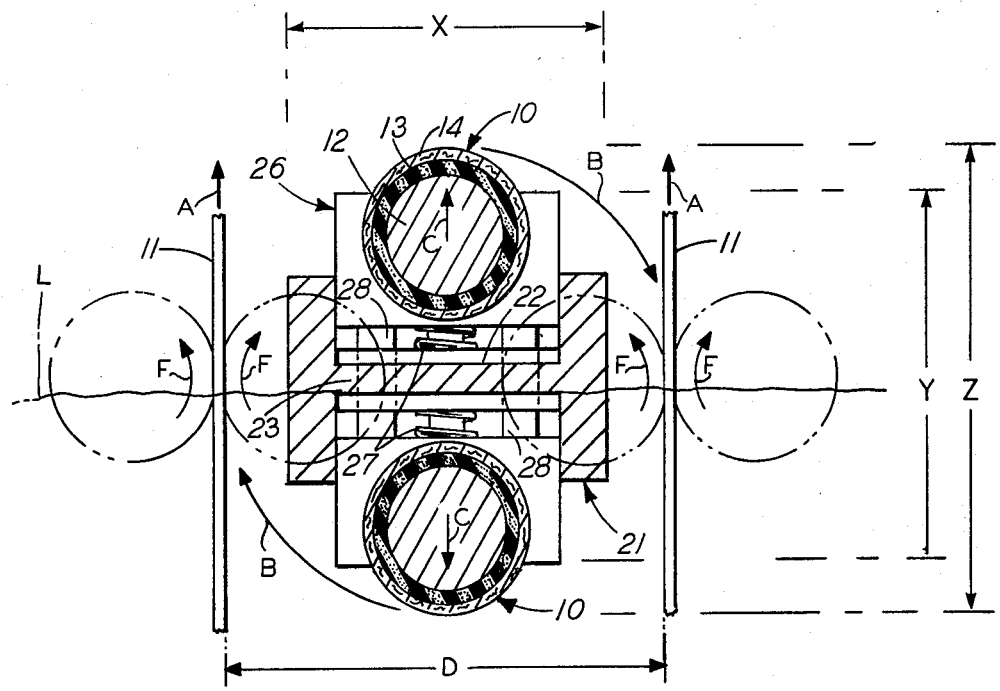
FIG. 2 is a vertical section of the assembly along line 2—2 of FIG. 1, illustrating also in phantom lines the manner in which the rollers are moved from the vertical position of FIG. 1 to a horizontal operating position between a pair of substrates to be coated.
Figure 3:
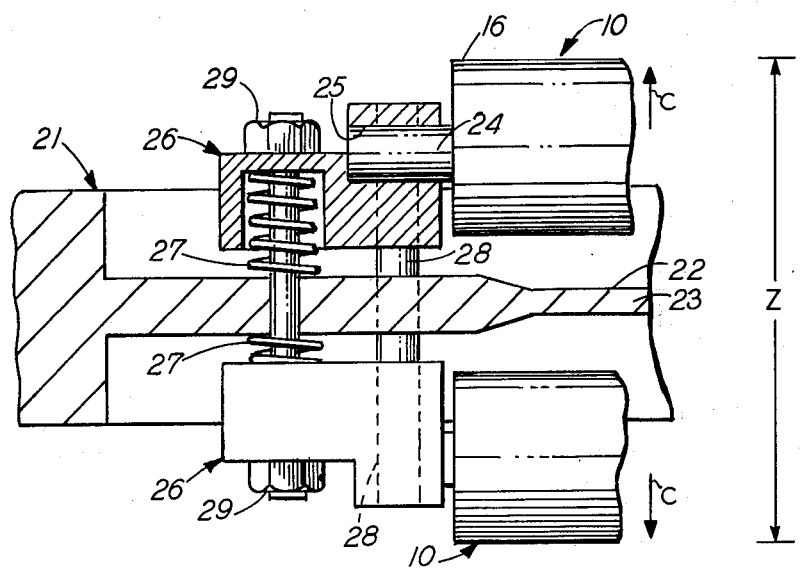
FIG. 3 is a fragmentary vertical section along line 3—3 of FIG. 1, illustrating details of the roller-arm assembly.

As illustrated in FIGS. 1, 2 and 3, the rollers 10 are individually mounted for free rotation on a plurality of elongated support bars or arms 21, preferably with each arm 21 carrying a pair of the rollers 10 on opposite faces thereof. As illustrated in FIGS. 1 and 2, the arms 21 can be rotated through an angle of 90° (arrow B) to position the rollers 10 either in a normal, horizontal operating position, in which the rollers 10 are mounted in horizontally spaced relationship to each other, as illustrated in FIG. 5 and in phantom lines in FIG. 2; or to position the rollers in a vertical position shown in FIGS. 1 and 3 and in solid lines in FIG. 2. In the vertical position, the rollers 10—10 are spaced vertically, one above the other, which permits the arm-roller assembly 10-21 to be inserted between two parallel substrates 11—11, as will be described in detail hereafter in connection with FIG. 4.

Preferably, the rollers 10 are rotatably mounted in elongated U-shaped rectangular grooves 22, which extend along the length of a generally H-shaped, central channel section 23 of each arm 21 on opposite faces thereof, as shown in FIGS. 1-3. Each groove 22 is slightly longer than the length of the companion roller 10, and has a size slightly greater than the diameter of the roller, so as to permit free rotation of each roller in a corresponding groove. To mount the rollers 10 in the grooves 22, each roller 10 is provided with a longitudinal axle 24 (FIG. 3) at each end thereof that is rotatably mounted in a conventional bearing socket 25 formed in an L-shaped mounting block 26. As illustrated in FIG. 1, a set of two opposing mounting blocks 26 is mounted on the arm 21 at the opposite ends of the grooves 22 so as to mount the opposed pair of rollers 10 on each arm for free rotation about their longitudinal axis.

As illustrated in FIGS. 2 and 3, the mounting blocks 26 are resiliently mounted to the channel member 23 at each end (15, 16) of the rollers 10—10 by compression springs 27, which serve to bias the rollers 10—10 outwardly away from the center of the arm 21 as indicated by arrows C—C in FIGS. 2 and 3, for reasons to be explained in further detail hereafter. The blocks 26 are slidably mounted on a set of guide rods 28 that are fastened to the channel member 23 so as to permit linear movement of the blocks 26 and rollers 10 toward and away from the center of the arm 21. A plurality of nut-and-bolt assemblies 29 are provided to set the outer limits of movement of the rollers 10 away from the center (arrows C) to a predetermined distance, so as to preset a desired maximum spacing Z (FIGS. 2 and 3) between the outer roller faces in the fully extended positions of the rollers 10—10.

Figure 4:
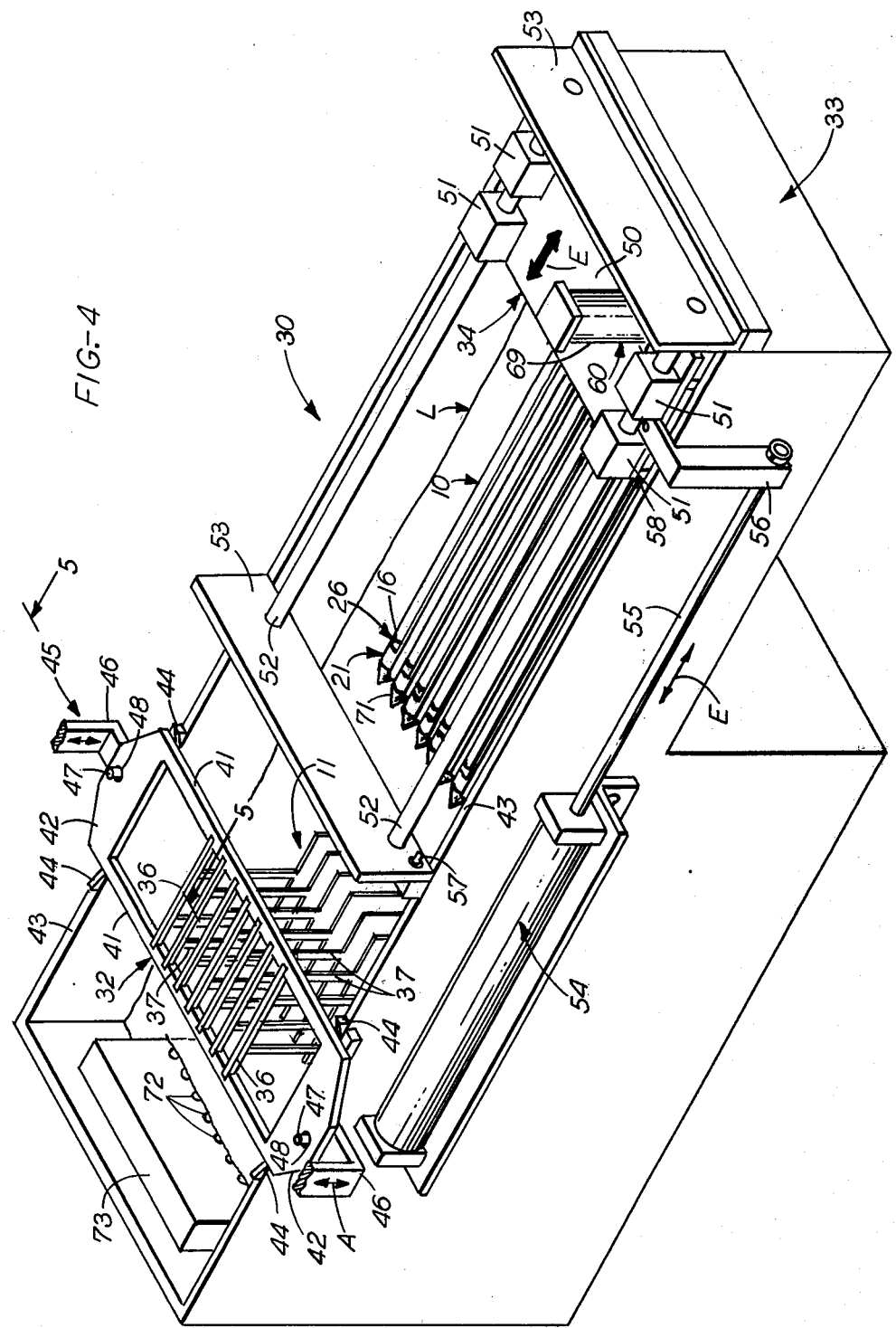
FIG. 4 is a perspective view of a complete apparatus in accordance with the invention, for applying and distributing a liquid coating onto opposed planar surfaces of a plurality of printed circuit substrates.
Figure 6:
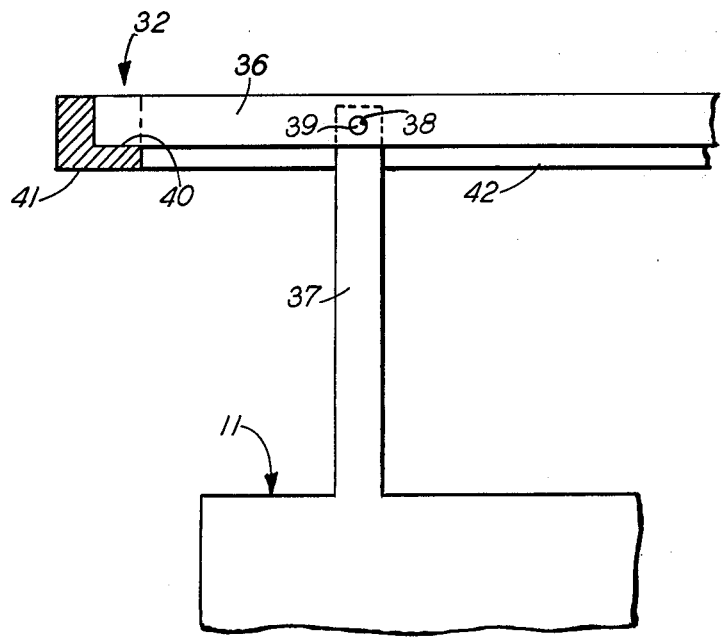
FIG. 6 is a fragmentary transverse vertical section along line 6—6 of FIG. 5, illustrating details of a substrate mounting rack.

Referring now to FIGS. 4-6, there is illustrated a complete apparatus 30 in accordance with a specific embodiment of the invention, for applying and distributing the coating liquid L onto opposed planar surfaces of a plurality of the printed circuit substrates 11, as previously described in general with respect to FIG. 5. The substrates 11 are individually hung in spaced, parallel relationship from a vertically movable mounting rack 32 at the left in FIG. 4, so that the substrates 11 are suspended vertically from the rack 32 and are spaced from each other by a preset horizontal distance D in FIGS. 2 and 5. The rack 32 functions to lower the substrates 11 into a tub or tank 33 of the liquid, as shown in FIGS. 4 and 5, at the start of each coating cycle, to initial coating positions where the substrates 11, or at least the portions of the surfaces to be coated, are completely submerged in the liquid; and to remove the substrates from the tank 33 of liquid L at the end of the coating cycle.

A plurality of the roller-support arms 21 are mounted cantilever fashion on a horizontally movable support frame 34 that is initially positioned in a rest position at the right of the tank 33, as viewed in FIG. 4, so that the arms 21 are mounted parallel to each other and project toward the spaces between submerged substrates 11 but do not make contact with the substrates. In this initial position, the substrates 11 are allowed to soak in the treating liquid, such as the low-viscosity sensitizer solution described in the copending application referred to above, for a desired soak time, for instance 90 seconds, after which the frame 34 is moved to the left, as indicated by arrow E, to insert the rollers 10—10 into the spaces D between the substrates 11—11 and into the operating, liquid-distributing positions previously described in connection with FIG. 5. Following this, the substrate rack 32 is lifted, as indicated by arrow A, to withdraw the substrates 11 from the liquid, with the substrate surfaces contacting the rollers 10—10 on each side as previously described with respect to FIG. 5. Further details on the operation of the rollers 10 to distribute the liquid on the surfaces of the substrate 11 are described hereafter under the heading "Operation."

During the soaking period and at all times prior to the start of a liquid-distributing operation, the arms 21 preferably are initially oriented in the horizontal rest positions, as shown in phantom lines in FIG. 2, with the rollers 10 spaced horizontally from each other and with the rollers 10 partly in and partly out of the liquid L. While in the horizontal position, preferably with less than half of the bottom portion of each roller 10 submerged as illustrated in FIG. 7, the chamois covering 14 at the top remains wet since the liquid L is absorbed, or wicked up, from the submerged portions through the chamois covering 14. Thus, while the arms 21 are in the horizontal rest position, the chamois layer 14 remains wet. This wicking characteristic of the chamois will be further described below.

At the start of a liquid-distributing operation, the arms are first rotated approximately 90° (arrow B) from the normal horizontal position to the vertical, insert positions shown in FIG. 1 and in solid lines in FIG. 2 to permit the support arms 21 and rollers 10 carried thereby to be inserted into the spaces D between adjacent substrates 11—11. For this purpose, the support arm 21 is formed with rectangular outer cross-sectional dimensions designated X and Y in FIGS. 1 and 2, the dimension X being sufficiently less than the distance D between each pair of substrates 11—11 that the arm 21 may easily be inserted into the space D in the vertical attitude shown in solid lines in FIG. 2, and then rotated 90° (arrow B) back to the horizontal operating position of FIG. 5.

The transverse dimension Y is sufficiently less than the distance D that, with a pair of the rollers 10 mounted on the arm 21 and spring-biased to the outer positions, the distance Z (FIG. 2) between the outer faces of the two rollers 10—10 in the fully extended positions is a predetermined small amount greater than the distance D between substrates 11—11. With this arrangement, the rollers 10—10 are compressed inwardly against the action of the biasing springs 27 as the arms 21 are rotated back to the horizontal operation positions and the roller faces engage the outer surfaces of the adjacent substrates 11—11, as shown in FIGS. 5 and 7 and as will be discussed in further detail hereafter.

In a typical example, the dimension X is 2.54 cm, Y is 2.54 cm, Z is 4.13 cm, D is 3.66 cm, and the substrate nominal thickness is 0.15 cm, which provides an interference, compression fit of 3.2 mm on each side between each substrate and the adjacent roller contact surface.

In the specific embodiment illustrated, where both sides of each substrate 11 are to be uniformly coated with the liquid, the number of roller arms 21 in the system is set equal to the number of substrates 11, plus one. For instance, if both sides of six substrates 11 shown in FIG. 4 are to be coated, then seven parallel roller arms 21 are utilized, so that the outer surfaces of each substrate 11, including the end substrates 11 of the rack, are resiliently engaged by an associated one of the rollers 10. Typically, nine support arms 21 are mounted on support frame 34 to simultaneously coat the surfaces of eight substrates 11. However, arrangements having any number of support arms 21 can be used depending on the number of surfaces to be coated.

In the specific embodiment of coating apparatus 30 illustrated in FIG. 4 and, in part, in FIGS. 5, 6 and 7, the mounting rack 32 for the substrates 11 includes a plurality of spaced, parallel support arms 36 for mounting the individual substrates 11 in the desired parallel spaced positions as described earlier. The arms 36 extend across the width of the rack 32 from left to right in FIG. 4, and each arm 36 securely holds the upper end portions, or tabs 37, at the upper end of the associated substrate 11, beyond the area of the substrate where printed circuits are to be deposited.

Each tab 37 has a hole 38 located at its upper end which hole is aligned with a corresponding hole in support arm 36 when the tabs 37 are inserted into spaced openings located in support arm 36 as illustrated in FIG. 6. A pin 39 is then inserted into the aligned holes to rigidly fasten each tab 37 to its support arm 36. Typically, the tabs 37 are an integral structural part of the substrate 11 which permit the arm 36 to securely support the substrate 11 in the proper vertical position when its associated tabs 37 are gripped by the arm as shown in FIGS. 5 and 6. A large substrate 11, e.g. about 45 cm by 60 cm would have two tabs for support, while small substrates require only a single tab. The tabs 37 are usually removed from the substrate 11 when no longer required in the process. However, any arrangement of holders or tabs which will accomplish this function may be utilized.

The ends of the arms 36 which grip the tabs 37 fit into spaced slots 40 situated in a pair of transverse support bars 41 of rack 32, which bars extend across the tank from front to rear as viewed in FIGS. 4 and 5, thereby locating the associated supported substrates in an aligned, parallel row spaced the preset horizontal distance D from each other. The rack 32 also includes a pair of flat mounting lips 42 at the ends of the bars 41, which are arranged to be seated on flat upper edges 43 of the tank 33, as illustrated in FIGS. 4 and 5, to mount the rack 32 and thus the substrates 11 in the desired position.

Upper edges 43 of tank 33 have mounted on them two pairs of guides 44—44 as shown on the left side of FIG. 4. Guides 44—44 in the shape of right triangles mounted with the hypotenuse of each triangle facing the rack 32, function to guide the rack 32 as it is being lowered by a conveyor 45 having a pair of transfer arms 46 into proper position on the tank 33, as discussed hereafter. For instance, if rack 32 is being lowered too far to the left or right along the tank 33, or is swaying back and forth, the rack will, as it is being lowered, come into contact with the guides or ramps 44—44 and be constrained by the guides to fit into the space between the pairs of guides 44—44. The rack 32 will then slide down the hypotenuse sides of the guides as it is being further lowered by arms 46 into the proper position on edges 43 of tank 33, as is shown in FIG. 4.

The rack 32 may be moved to and from the tank 33, and moved vertically to lower the substrates 11 into the tank or raised to withdraw them by the conveyor 45, which may be a conventional, computer-controlled conveyor system such as a standard overhead hoist system manufactured by NAPCO of Waterbury, Conn. In the embodiment illustrated, the conveyor 45 includes a pair of depending L-shaped transfer arms 46, which are equipped at their inner ends with a pair of upstanding vertical pins 47 adapted to fit into a pair of locating holes 48 formed in the rack lips 42, so that the conveyor 45 can raise or lower the rack 32 as required, and can also transport it horizontally and vertically to and from other treating tanks or work stations, in generally conventional fashion. However, any hoist system which accomplishes this result may be employed.

As illustrated in FIG. 4, the roller support frame 34 includes a flat mounting plate, or support bar 50, having four guideblocks 51, mounted thereon which are slidably movable along a pair of cylindrical guide rails 52, for horizontal movement of the frame 34 back and forth along the right half of tank 33 (arrow E). The rails 52 are permanently affixed to the tank by means of mounting brackets 53 located at the right-most end of tank 33 and at a point approximately halfway along the length of the tank. A generally conventional piston-and-cylinder system 54 is provided, connected by a piston rod 55 to a depending arm 56 of the mounting plate 50 for moving the frame 34 and roller assemblies carried thereby to and from the operating position along the rails 52 as shown at the right in FIG. 4.

A limit switch 57 is provided, mounted for example along the front rail or edge 43 of the tank 33 adjacent to the operating position, which is engaged and activated by a front face 58 of the left front guide block 51 when the rollers have been moved to the operating position at the left, to provide a signal to a generally conventional control circuit (not shown) that the rollers 10—10 have been fully inserted into the spaces between the substrates 11—11.

Figure 8:
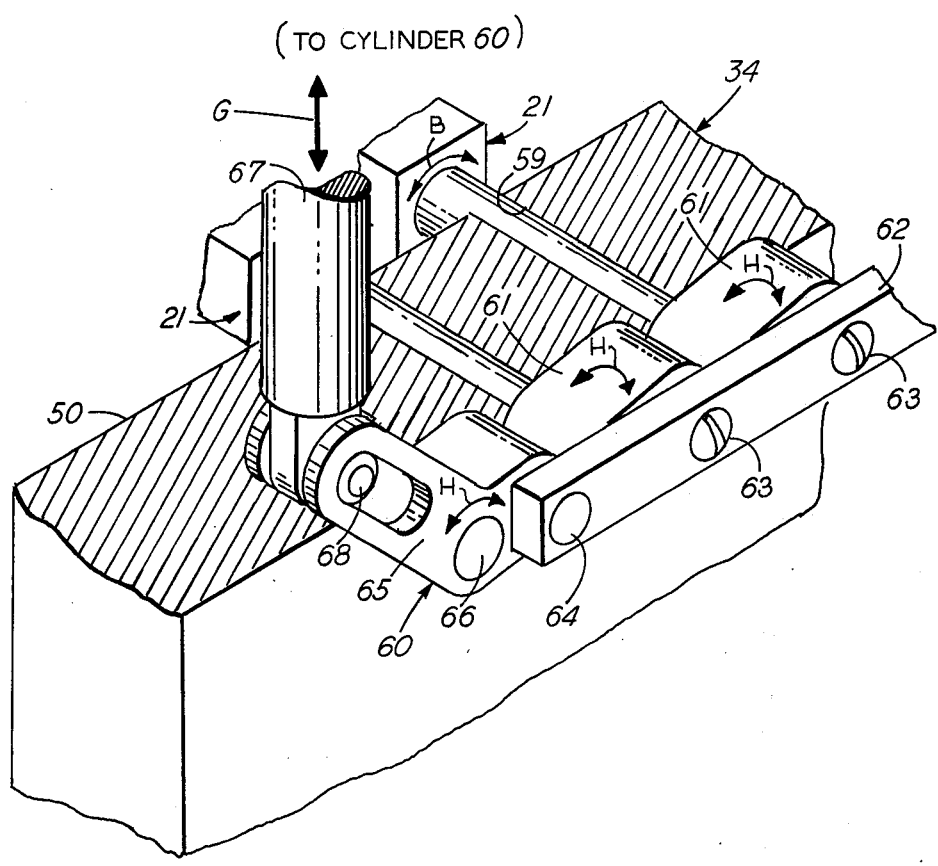
FIG. 8 is an enlarged perspective view of a part of the mechanism for rotating the roller arms illustrated in FIG. 4 into various operating positions.

Support arms 21 are mounted in and through individual mounting apertures 59 in mounting plate 50, as shown in FIG. 8, such that each of the support arms is carried by the mounting plate 50 and is also free to rotate about its own longitudinal axis (arrow B).

The roller-support assembly 34 also includes a mechanism 60 for selectively rotating all of the support arms 21 approximately one-quarter of a turn or 90° (arrow B) from the normal horizontal position of FIG. 5 to the vertical insert position of FIG. 2 before the support frame 34 begins movement to the left, and for rotating the arms 21 back to the horizontal positions after initial insertion of the rollers between the substrates 11—11. The rotating mechanism 60 includes a crank 61 connected at one end to the right end of each arm 21, as viewed in FIG. 8, which cranks 61 are located along the right side of mounting plate 50 of FIG. 4. As described above, the arms 21 are mounted in and extend through the plate 50 from left to right of FIG. 4 such that the arms can rotate about their own horizontal axis.

The other end of each crank 61 is connected to a transverse bar 62 by a pin 63. The transverse bar 62 is connected at its left end of FIG. 8 by a pin 64 to a dog-leg shaped arm 65, which is pivoted at pin 66 and attached at the other end to a piston 67 by a pin 68. Piston 67 moves in a vertical direction (arrow G) and is operated by a conventional pneumatic cylinder 69 shown on FIG. 4. As presently view in FIG. 8, the piston 67 is in the up position with the roller support arms 21 in the horizontal roller position of FIG. 5. When it is desired to place the roller support arms 21 in the vertical position of FIGS. 2 and 4, for example at the start of roller-positioning operation, pneumatic cylinder 69 is activated, moving piston 67 down thereby causing dog-leg arm 65 to pivot about point 66 and rotating pin 64 up in a counterclockwise direction toward piston 67 (arrow H). Transverse bar 62, which is rotatably attached to dog-leg arm 65 at pin 64 is also pulled up in a counterclockwise direction, thereby rotating the cranks 61 and attached arms 21 in the same direction. Pneumatic cylinder 69 is operational to move piston 67 only a preset vertical distance, which distance results in dog-leg arm 65 rotating arm 62, cranks 61 and roller bars 21 only one-quarter of a turn or 90°. The roller support arms 21 which have been rotated 90° from the horizontal position are now in the vertical position shown in FIGS. 1 and 4 and the roller assembly 30 is ready to be moved to the insert position at the left in FIG. 4 (arrow E) as previously described.

After the vertically oriented arms 21 have been inserted and the roller assembly 30 has traversed to the operating position at the left, the limit switch 56 triggers the operation of the cylinder 69 to retract piston 67, which moves up to the position presently shown in FIG. 8. As piston 67 moves up, dog-leg arm 65 pivots in a clockwise direction about pivot point 66 thereby rotating transverse arm 62 down into the position shown in FIG. 8 causing cranks 61 to return to the position shown with the attached roller support arms 21 in the horizontal operating position of FIGS. 5 and 7, in which the rollers 10—10 are compressed between the substrates 11—11 preparatory to withdrawal of the substrates 11 from the tank between the rollers 10 (arrow A), as previously described in general terms, to apply the liquid coating to the substrates in accordance with the principles of the invention.

OPERATION

In order to provide a better understanding of the principles of the invention, and of the details of operation of the specific embodiment of a complete coating system 30 illustrated in FIG. 4, a full cycle of operation of the coating system will now be described in detail. Prior to the beginning of each coating cycle, the conveyor 45 lowers a rack 32 of substrates 11 to be coated into proper position on the rails 43 of the tank 33, as maneuvered by guides 44—44. When the rack 32 is deposited by the conveyor, the vertically suspended, parallel substrates 11 are fully submerged in the coating fluid L to a desired depth. The liquid level in the tank 33 is maintained constant at a desired level, by any conventional level-control system.

At this time, the roller-support frame 34 is positioned in the initial or rest position at the right in FIG. 4, with the roller-support arms 21 in the normal horizontal positions of FIG. 5, projecting toward but out of engagement with the substrates 11. The liquid level is set so that, in this horizontal rest position of the arms 21, each of the rollers 10 has its lower portion submerged in the coating liquid L as illustrated in FIG. 7.

After the substrates 11 have soaked in the liquid for the allotted time, the control system signals the arm-rotating mechanism 60 to lower piston 67 thereby rotating the cranks 61 in FIG. 8 so that each roller arm 21 is turned approximately 90° (arrow B) and is now in the vertical, insert position of FIG. 1. Also, the control system signals the piston-cylinder assembly 54 to move the roller-support frame 34, along the guide rails 52, (arrow E) to the operating position at the left in FIG. 4 where the roller support arms 21, in their vertical orientations, have been fully inserted into the preset spaces (D) between the substrates 11—11. Substrates 11—11 are suspended from rack 32 by rigid tabs 37 at a predetermined distance D from each other. As described above, each substrate 11 is typically suspended by two rigid tabs 37 which are an integral structural part of the substrate and are mounted on a transverse bar 41 of rack 32. Bar 41 aligns and holds the tabs 37 and associated substrate 11 in a predetermined horizontal position, from front-to-rear, at a distance D from the adjacent substrates 11, as shown in FIG. 4. As previously noted, the width dimension X (FIGS. 1 and 2) of each arm 21 is sufficiently less than the distance D (FIG. 2) between substrates 11—11 that the arms 21, in the vertical positions, may easily be threaded into the spaces between substrates.

To assist in properly locating the support arms 21 with respect to the substrates 11 for insertion, the front or free end 71 of each arm is tapered, as shown in FIGS. 1 and 4, so as to fit into a corresponding conical locating slot 72 of a shelf 73 forming part of the tank 33, as shown at the left side of FIG. 4.

When the roller-frame assembly 34 has been moved to the operating position, the face 58 of the left-front block 51 trips the switch 57, so as to signal the control system that the support frame 34 is in the operating position. Following this, the rotating mechanism 60 is operated to raise piston 67 thereby returning the arms 21 to the horizontal operating positions of FIG. 5, in which the rollers 10 are now compressed inwardly by a preset amount between the adjacent contact faces of the substrates 11—11, as shown in FIGS. 5 and 7.

As described above and shown in FIG. 3, the rollers 10 are resiliently mounted in the arms 21 by compression springs 27, which allow each roller 10 to move inwardly toward the center of arm 21, against the biasing action of the springs 27, as each roller is revolved with its arm 21 into engagement with the adjacent substrate 11. As the rollers 10 are thus forced inwardly by the substrates 11 on contact, the compressed springs 27 exert predetermined forces urging the rollers into compressive engagement with the adjacent surfaces of the substrates 11. The location of each roller 10 can be set to contact substrates 11 of various thickness so as to achieve proper compression of the roller 10.

As illustrated in slightly exaggerated fashion in FIG. 7, the outer chamois layer 14 of each roller 10 and the intermediate silicone rubber or polyurethane compression layer 13 are compressed between the face of the adjacent substrate 11 and the solid metal core 12 of the roller by a preset amount, so that the outer two layers 13 and 14 are deformed into the flattened configuration of FIG. 7, somewhat similar to a low pressure automobile tire. With this arrangement, a relatively substantial flat area surface contact is made between the chamois layer 14 and the adjacent substrate surface, as illustrated and described in detail hereafter.

At any time after the rollers 10 have been turned to the horizontal operating positions of FIGS. 2 and 5, the conveyor 45 is operated so that the conveyor pins 47 are positioned in the locating holes 48 of the substrate-mounting rack 32 and the conveyor 45 begins to lift the rack 32 so as to withdraw the substrates 11 from the tank 33 (arrow A) at a slow controlled rate, such as 2.29 cm per second in one typical example of coating epoxy-coated substrates 11 with a sensitizer liquid as described in the copending application cited earlier. The thickness of the sensitizer liquid coating which is applied to the surface of the substrate 11 may be adjusted by varying the rate at which the substrate is removed from the bath, slower for a thicker coating, faster for a thinner coating.

As each substrate 11 is advanced between a pair of the rollers 10—10, the freely rotatable rollers 10 rotate slowly in synchronism with the substrate movement, as indicated by arrows F in FIGS. 5 and 7, similarly to rotation of pinion gears in mesh with a longitudinally advancing rack.

As previously mentioned, the outer layer 14 of the roller is composed of a liquid-absorbing material, such as synthetic chamois, which in common with any liquid-absorbing material is capable of absorbing and holding a specific amount of any particular liquid in a normal, uncompressed state. However, the chamois and chamois-like materials preferably employed in the practice of this invention have another important characteristic: that is, the materials have "inverse sponge" characteristics, meaning that they can absorb a specific, constant amount of liquid when in a wet compressed state, as described in the following paragraphs.

To explain how this inverse-sponge principle is applied to the coating process of this invention; when a particular segment of the chamois layer 14, in the uncompressed state, enters the liquid L, such as at a point 80 at the right in FIG. 7, it travels around the roller along an arcuate path to the point 81 of first contact with the adjacent substrate 11, during which time (arc 80-81) it absorbs a given amount of the liquid for the uncompressed chamois. After the first contact point 81, the chamois layer is compressed a predetermined amount between the substrate surface and the compression layer 13 and then advances generally vertically below the liquid level along the flattened contact region 81-82. During this period, excess liquid is squeezed from the chamois during advancement from point 81 to point 82, at which point the chamois layer emerges from the liquid L.

As the chamois layer emerges from the liquid, it remains compressed while continuing to advance generally vertically with the substrate 11 along the section 82-83-84 above the liquid surface. Point 83 represents the contact point between roller 10 and substrate 11 which is horizontally parallel with the longitudinal axis of the roller and thus is the point where the roller 10 exerts maximum compressive force against the substrate surface with which it comes into contact. As will be explained in detail below, the level of liquid L must be kept below the horizontal axis of the roller 10, or the contact point 83, in order to achieve the best coating results.

Although the chamois layer 14 is compressed, it has the ability to absorb, or "wick", excess liquid with which it comes into contact. Wicking may be defined as the thin transfer of liquid along the chamois layer from a compressed region to a less compressed region; similar to the transfer of liquid along the wick of a candle or lantern. In the present embodiment, the excess liquid is rapidly wicked to a region of the chamois which is capable of absorbing and storing additional liquid, such as the portion of the chamois layer between points 84 and 80, which portion has just previously been compressed, but is now in the uncompressed state and can absorb and hold additional liquid. The uncompressed chamois between points 84 and 80 acts as an unfilled reservoir which the compressed chamois layer between points 83 and 84 can wick excess liquid L into.

As stated previously, the chamois layer 14 continues to be compressed between point 82 and point 83 and some liquid is absorbed from the wet substrate surface with which it is in contact. However, since the chamois layer 14 has not yet passed the point of maximum compression, point 83, the chamois layer is not capable of fully absorbing and wicking excess liquid through point 83 to the uncompressed portion of the layer between points 84 to 80. This is important since wicking of the liquid from the liquid contained in the tank 32 itself to the uncompressed portion between points 84 to 80 is prevented. Thus the level of the liquid L in tank 32 should preferably be kept below the point of maximum compression point 83 in order for this point to act as a buffer against wicking from the tank contact liquid. If the level of the liquid L in the tank 32 is allowed to cover point 83, the compressed chamois will absorb and wick liquid directly from the tank 32, and not from the substrate surface with which it is in contact, and thus not apply a uniform coating of the liquid L on the surface of the substrate 11.

During its travel from point 82 to point 84, the compressed chamois layer 14 absorbs liquid from the adjacent wetter surface of the substrate 11 and transfers the liquid along the chamois layer to the uncompressed portion from point 84 to point 80. Since the compressed chamois can capture and wick only a specific amount of the liquid during the time it is in contact with substrate 11, a predetermined uniform coating of the liquid is thus left on the surface of substrate 11, after it loses contact with the chamois layer 14 at the uppermost contact point 84. In this embodiment, a sensitizer liquid layer which deposits 8 micrograms of copper per $cm^2$ is recommended.

Since the roller 10 shown in FIG. 7 is rotating in a clockwise direction (arrow F) as substrate 11 is being removed from the tank 32, the chamois layer 14 is entering the liquid L at point 80 which acts to inhibit any wicking effect which may take place at that point.

Where the substrate has apertures, such as thru holes 90 shown in FIG. 7, the holes 90 are first filled with the sensitizer liquid during the initial soaking period when the substrate 11 is submerged in the liquid L. However, as each hole 90 passes through the liquid-distributing section 82-84 of FIG. 7, the chamois layer 14 sucks excess liquid from the hole 90, leaving only a given amount of the liquid coating the walls of the hole 90, and prevents formation of windowpanes of the liquid covering the aperture 90, for instance at the mouth 91 of the aperture.

In addition, just before a bottom edge 92 of the substrate 11 passes the separation point 84 of FIG. 7 between substrate and chamois, the chamois layer 14 is still in flat area contact with the surface of substrate 11 adjacent to the edge 92, and the chamois layer 14 thereby functions to absorb any excess liquid that would otherwise tend to remain along the bottom edge 92 of the substrate 11, as the substrate 11 finally advances upward beyond the final point of contact 84 with the chamois layer. With this arrangement, the sensitizer liquid L is applied to the substrate 11 in a dripless manner, which prevents formation of any buildup or ridges of the liquid along the edges of the substrate and particularly along the bottom edge 92.

As used in this application and the appended claims, the phrase "material having inverse sponge characteristics" is intended to designate natural or synthetic chamois, or other equivalent chamois-like materials having the property of being able to absorb predetermined amounts of liquid from a wet contacting surface, after emergence of the material in a wet compressed state from a bath of the liquid, by moving or wicking the amounts of liquid to an area of the material capable of holding the absorbed liquid, as described above.

While various specific examples and embodiments of the invention have been described in detail hereinabove, it should be obvious that various modifications may be made from the specific details, steps and materials described, without departing from the spirit and scope of the invention.

What is claimed is:

1. A liquid-applicator member for applying a uniform coating of a liquid on a wet surface of an article, which comprises:
   an outer layer of a compressible liquid-absorbing material having inverse sponge characteristics and composed of chamois or synthetic chamois, adapted to contact the wet surface of the article; and
   an inner portion of compliant material in engagement with the outer layer and adapted to compress the outer layer against the surface of the article to be coated so that the outer layer distributes a uniform coating of the liquid on the contacted surface of the article.

2. A liquid-applicator member as recited in claim 1, wherein the liquid-applicator member comprises a roller having a solid cylindrical core, an intermediate annular layer of compliant material fastened on the core and comprising the inner portion, and an outer annular layer of the liquid-absorbing material fastened on the intermediate layer.

3. Apparatus for applying a uniform coating of a liquid on a wet surface of an article, which comprises:
   a liquid-applicator member including an outer layer of a compressible liquid-absorbing material and composed of chamois or synthetic chamois having inverse sponge characteristics and an inner portion of compliant material in engagement with the outer layer; and
   means for mounting the applicator member in compressive engagement with the wet surface of the article so as to compress the outer layer between the article surface and the inner portion so that the outer layer distributes a uniform coating of the liquid on the contacted surface of the article.

4. Apparatus for applying and distributing a uniform coating of a liquid on a surface of an article, which comprises:
   a bath of the liquid;
   means for immersing the article surface in the bath so as to wet the surface with the liquid;
   a liquid-applicator member including an outer layer of a compressible liquid-absorbing material having inverse sponge characteristics and an inner portion of compliant material in engagement with the outer layer;
   means for mounting the applicator member partially in the bath so that the outer layer absorbs a predetermined quantity of the liquid and with portions of the outer layer in compressive engagement with the wet surface of the article in the bath so as to compress the wet outer layer between the article surface and the inner portion; and
   means for moving the article and the applicator member while compressed together in surface contact from a position where the contacting surfaces are immersed in the bath to a position where they are clear of the bath so that the outer layer absorbs a predetermined amount of the liquid from the wet surface due to said inverse sponge characteristics and thereby leaves a uniform predetermined amount of the liquid coating the surface of the article.

5. Apparatus as recited in claim 3 or claim 4, wherein:
   the applicator member further includes a solid core;
   the inner portion of the applicator member comprises an intermediate layer of the compliant material sandwiched between the solid core and the outer layer; and
   the mounting means includes means for applying a force between the core and the article so as to compress the intermediate layer against the core and to compress the outer layer between the intermediate layer and the surface of the article to be coated.

6. Apparatus as recited in claim 3, or claim 4, wherein the liquid-applicator member comprises a roller having a solid cylindrical core, an intermediate annular layer of compliant material fastened on the core and comprising the inner portion, and an outer annular layer of the liquid-absorbing material fastened on the intermediate layer.

7. A liquid-applicator member as recited in claim 6, wherein the mounting means includes means for applying a force between the roller and the article so as to compress the intermediate and outer layers between the solid core and the article surface and to deform the outer layer into a flattened section along the region of contact with the surface of the article.

8. Apparatus as recited in claim 4, wherein the applicator member and mounting means are so arranged that successive segments of the outer layer first advance through the liquid in an uncompressed state to a point X (81, FIG. 7) where they first engage the wet article surface beneath the surface of the liquid, then advance in the compressed state engaged with the article from the point X to a point Y (84, FIG. 7) of disengagement located a predetermined distance above the liquid surface, following which they return to the uncompressed state out of the liquid, wherein the newly uncompressed segments of the material beyond the point Y wick-up liquid from the compressed material in the region X-Y, thereby providing said inverse sponge characteristics and permitting the material in the compressed region X-Y to absorb the predetermined amount of liquid from the wet surface to leave a uniform thickness film of the liquid coating the article surface.

9. Apparatus as recited in claim 8, wherein the applicator member and mounting means are further so arranged that successive segments of the outer layer are compressed increasingly from the point X to a point Z (83, FIG. 7) of maximum compression midway between points X and Y and then decompressed increasingly between points Z and Y, and wherein the point Z is located above the surface of the liquid.

10. Apparatus as recited in any of claims 4, 8 or 9 wherein the outer layer of the applicator member is composed of chamois or synthetic chamois.

11. Apparatus for applying a uniform coating of a liquid to an article having at least one flat surface portion to be coated, which comprises:
    means for suspending the article in a bath of the liquid so that the surface to be coated is immersed in the liquid;
    a rotatable liquid-applicator roller including an outer surface layer of a compressible liquid-absorbing material having inverse sponge characteristics and an inner layer of compliant material in engagement with the outer layer;
    means for mounting the roller in the bath with the outer layer partly in and partly out of the liquid so that the portions of the outer layer in the bath absorb a predetermined quantity of the liquid, the roller being further mounted adjacent to the article so that the wet outer surface layer of the roller compressively engages a portion of the wet surface of the article to be coated with the wet outer layer being compressed between the article surface and the inner compliant layer of the roller; and
    means for withdrawing the article from the bath and for rotating the roller in synchronism with the movement of the article so that the outer surface layer of the roller engages successive portions of the article and so that the compressed outer layer absorbs a predetermined amount of the liquid from the wet surface due to said inverse sponge characteristics as the contacting surfaces of the roller and article exit from the bath, thereby to leave a uniform coating of the liquid on the article surface.

12. Apparatus as recited in claim 11, for uniformly coating both outer surfaces of a flat planar substrate, wherein:
   a pair of opposed rollers is provided, and the mounting means are arranged for mounting the rollers on opposite sides of the substrate in compressive engagement with portions of the substrate on opposite outer surfaces thereof, so that the substrate advances between the rollers as it is withdrawn from the bath and that advancement of the substrate causes the rotation of the rollers.

13. Apparatus as recited in claim 12 wherein the rollers are positioned such that less than half of each roller is immersed in the liquid.

14. Apparatus for applying a uniform coating of a liquid to the outer surfaces of a plurality of flat planar substrates, which comprises:
   means for suspending the substrates vertically in a bath of the liquid so that the surfaces to be coated are immersed in the liquid and so that the substrates are aligned in a parallel row and are spaced a predetermined distance from each other;
   a plurality of freely rotatable liquid-applicator rollers having deformable liquid-absorbing contact surfaces;
   a plurality of support arms on which the rollers are mounted for free rotation about longitudinal axes thereof;
   means for moving and positioning the support arms so that (1) the rollers are initially retracted from substrate-engaging positions in the spaces between the substrates, and (2) the rollers are thereafter moved into the spaces between the substrates and then into substrate-engaging positions where the contact surfaces of the rollers compressively engage the opposite surfaces of the substrates; and
   means for withdrawing the substrates from the bath after the rollers have been compressively engaged with the substrates so that, as each substrate is withdrawn from the bath, it is advanced between a pair of the rollers in compressive engagement with the contact surfaces of the rollers so that advancement of the substrates causes synchronous rotation of the rollers and so that the contact surfaces of the rollers distribute uniform coatings of the liquid along the contacted surfaces of the substrate.

15. Apparatus as recited in claim 14, wherein the means for moving the support arms comprises:
   a support frame on which the arms are mounted in parallel so that the arms and rollers project from the frame toward the spaces between the substrates, the arms being rotatably mounted in the frame for rotation about longitudinal axes of the arms, the axes of rotation of the arms being displaced from the axes of rotation of the rollers carried thereby; and
   means for rotating the arms about their axes through arcs set to revolve the rollers about the axes of the arms from first positions where the rollers do not engage the substrates to second, operating positions where the rollers engage the substrates.

16. Apparatus as recited in claim 15, wherein each support arm carries a pair of the rollers mounted parallel to each other on opposite faces of the support arm so that each substrate is engaged between a pair of rollers carried by two adjacent support arms.

17. Apparatus as recited in claim 16, further comprising resilient means for biasing each roller away from the axis of the associated support arm and into compressive engagement with the adjacent surfaces of the substrate in the engaging positions, so as to deform the contact surface of each roller into a flattened section along the region of contact with the surface of the substrate.

18. Apparatus as recited in claim 15, wherein the means for rotating the support arms comprises:
   a plurality of crank arms mounted on the frame and attached to the roller arms at the ends thereof opposite to the substrates, for rotating the roller arms;
   drive means having a reciprocable piston; and
   linkage means for rotating the crank arms in response to reciprocation of the piston.

19. Apparatus as recited in claim 15, wherein the means for moving the support arms further comprises:
   a guide assembly on which the frame is mounted for horizontal movement toward and away from the substrates so as to position the roller arms in either of two positions: (1) a rest position in which the arms are retracted from positions in alignment with the substrates and project toward the spaces between the substrates, and (2) a forward, operating position in which the arms and rollers carried thereby have been inserted into the spaces between adjacent substrates; and
   means for moving the frame between the two positions, the means for rotating the arms being arranged to rotate the arms to the first position prior to the time that the arms are inserted between the substrates and to rotate the arms to the second, operating positions after the frame has been moved to the second position and prior to the withdrawal of the substrates from the bath.

20. Apparatus as recited in any of claims 11, 12 or 13, wherein each roller and the mounting means are so arranged that successive segments of the outer layer of each roller first advance through the liquid in an uncompressed state to a point X (81, FIG. 7) where they first engage the adjacent surface of the article beneath the surface of the liquid, then advance in the compressed state engaged with the article surface from the point X to a point Y (84, FIG. 7) of disengagement located a predetermined distance above the liquid surface, following which they return to the uncompressed state out of the liquid, wherein the newly uncompressed segments of the material beyond the point Y wick-up liquid from the compressed material in the region X-Y, thereby providing said inverse sponge characteristics and permitting the material in the compressed region X-Y to absorb the predetermined amount of liquid from the wet surface to leave a uniform thickness film of the liquid coating the article surface.

21. Apparatus as recited in claim 20, wherein each roller and mounting means are further so arranged that successive segments of the outer layer are compressed increasingly from the point X to a point Z (83, FIG. 7) of maximum compression midway between points X and Y and then decompressed increasingly between points Z and Y, and wherein the midpoint Z of maximum compression is located above the surface of the liquid.

22. Apparatus as recited in any of claims 11, 12, 14 through 19, or 21, wherein each roller includes an outer surface layer of chamois or synthetic chamois comprising the deformable liquid-absorbing contact surfaces.

23. Apparatus for applying a uniform coating of a liquid on the surface of a plurality of substrates, the substrates being suspended in vertical positions spaced a predetermined distance from each other and immersed in a bath of the coating liquid, comprising:

- a plurality of support arms horizontally positioned in the bath and capable of being moved in a horizontal direction along the bath, each support arm having a pair of freely rotating rollers mounted thereon with the rollers on each arm being resiliently mounted parallel to each other on opposite sides of the arm, each roller including an outer compressible layer of synthetic chamois or chamois-like material and an inner layer of compliant material in contact with the chamois layer;
- means for rotating each of the support arms approximately ninety degrees about a horizontal axis such that the rollers are in one of two positions: (1) a horizontal position with the rollers on each support arm arranged side by side and with less than half of each roller being in contact with the liquid, and (2) a vertical, insert position with the rollers of each support arm arranged one above the other;
- means for moving the plurality of support arms horizontally along the bath to either an operation position or a rest position, the operation position being one in which the arms are located in the spaces between the immersed substrates, and the rest position being one in which the arms are retracted from the substrates;
- means for removing the substrates from the bath; and
- means for activating the removing means after the moving means has moved the arms arranged in the vertical insert positions from the rest position to the operation position with the arms located in the spaces between each of the immersed substrates, and after the rotating means has rotated the arms from the vertical insert positions to the horizontal positions, such that as the substrates are being removed from the bath, the surfaces of the substrates contact and compress the outer layers of the partly immersed resiliently mounted rollers, the removing movement of the substrates causing a synchronous rotation of the contacted rollers whereby the compressed outer layers of the contacted rollers apply a uniform coating of the liquid along the contacted surfaces of the substrates during the synchronous movement of the rollers and substrates.

* * * * *